US 6,535,072 B2

(12) United States Patent
Yamashita et al.

(10) Patent No.: US 6,535,072 B2
(45) Date of Patent: Mar. 18, 2003

(54) VOLTAGE CONTROLLED OSCILLATOR, VOLTAGE CONTROLLED OSCILLATOR DEVICE AND RADAR DEVICE

(75) Inventors: Sadao Yamashita, Kyoto-fu (JP); Kazumasa Haruta, Kyoto-fu (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/907,356

(22) Filed: Jul. 17, 2001

(65) Prior Publication Data

US 2002/0024396 A1 Feb. 28, 2002

(30) Foreign Application Priority Data

Jul. 24, 2000 (JP) ........................................ 2000-223122

(51) Int. Cl.$^7$ .............................................. H03B 11/10
(52) U.S. Cl. .............. 331/107 G; 331/99; 331/107 DP; 331/107 SL
(58) Field of Search ................ 331/99, 107 G, 331/107 D, 107 DL, 107 SL, 116 R, 116 FE, 107 T

(56) References Cited

U.S. PATENT DOCUMENTS 5,130,675 A * 7/1992 Sugawara .................. 331/99
5,942,950 A * 8/1999 Merenda .................... 331/99

FOREIGN PATENT DOCUMENTS

| JP | 5341032    | 12/1993 |   |
|----|------------|---------|---|
| JP | 659023     | 3/1994  |   |
| JP | 688870     | 3/1994  |   |
| JP | 10-563327  | 2/1998  | * |

OTHER PUBLICATIONS

0054944A1, Sakamoto et al., Dec. 27, 2001.*

* cited by examiner

Primary Examiner—Tuan T. Lam
(74) Attorney, Agent, or Firm—Dickstein, Shapiro, Morin & Oshinsky, LLP.

(57) ABSTRACT

A voltage controlled oscillator, a voltage controlled oscillator device, and a radar device provided therewith which can detect when the oscillation frequency becomes uncontrollable. According to one embodiment, a Gunn or other oscillation device is connected to a main line and a varactor diode which is a variable reactance element is connected between the main line and a sub line to constitute a voltage controlled oscillator. A control voltage is applied to the varactor diode via a switching circuit, and the presence or absence of oscillation or a failure of the varactor diode or oscillation device is detected by a detection signal, for example, from the varactor diode as monitored by a voltage monitor, and/or from the oscillation device, as monitored by a current sensing device.

23 Claims, 3 Drawing Sheets

VOLTAGE CONTROLLED OSCILLATOR, VOLTAGE CONTROLLED OSCILLATOR DEVICE AND RADAR DEVICE

BACKGROUND OF THE INVENTION

1. Field of the Invention

The present invention relates to a voltage controlled oscillator, a voltage controlled oscillator device, and a radar device provided therewith.

2. Description of the Related Art

Generally, in radar devices including an on board radar, it is important to detect whether or not the devices are operating normally to ensure their reliability.

Conventional radar devices have been disclosed in (1) Japanese Unexamined Patent Application Publication No. 5-341032, (2) Japanese Unexamined Patent Application Publication No. 6-59023, and (3) Japanese Unexamined Patent Application Publication No. 6-88870.

However, the above-described conventional radar devices have the following problems.

The radar device in (1) detects the drain voltage of a multiplier which multiplies the high frequency signal outputted from an oscillator and detects any failure from the detected value; however, it detects only the presence or absence of oscillations and it cannot detect whether or not the radar device is modulating normally. Further, this radar device cannot be applied to a configuration in which the oscillation is achieved by a direct wave without using any multiplier.

The radar device in (2) detects a failure by a change in the current of the whole circuit, and thus, it detects only the failure of an element with the current flowing therein, and it cannot detect any non-oscillating state caused by other failures. Further, it is very difficult to establish a standard for judging failures.

Since the radar device in (3) detects failure by the presence or absence of the gate current in transistors constituting oscillators and multipliers, it can detect only failure of semiconductor devices having gate terminals, and it cannot detect any non-oscillating state caused by other failures.

SUMMARY OF THE INVENTION

Accordingly, it is an object of the present invention to provide a voltage controlled oscillator, a voltage controlled oscillator device, and a radar device provided therewith which can solve the above-described problems, detect when the oscillation frequency becomes uncontrollable, detect any failure of an element with little current flowing therein, and detect a non-oscillating state even in a circuit using semiconductor elements having no gate terminals.

A voltage controlled oscillator in accordance with the present invention comprises a line, a variable reactance element connected to the line, directly or indirectly via a resonator, an oscillation device connected to the line, and a unit to output a signal detected by the variable reactance element. This means that the detection signal appears in the above-described variable reactance element when the variable reactance element is operating normally and the oscillation device is in the oscillating state, and it can be detected whether the variable reactance element is operating normally or abnormally in the oscillating state by monitoring the detection signal.

Further, the voltage controlled oscillator in accordance with the present invention may further comprise a signal output unit to detect the current flowing in the oscillation device. It can be detected whether or not the non-oscillating state is attributable to a failure of the oscillation device, and also the failure of the oscillation device can be detected. In addition, each state of failure of the variable reactance element and the oscillation device can be detected through the combination of the monitoring of the detection signal by the variable reactance element with the monitoring of the current flowing in the oscillation device.

The voltage controlled oscillator in accordance with the present invention may comprise a pick-up which is weakly coupled to the line having the above oscillation device connected thereto, and a diode for detecting a signal detected by the pick-up. This detection signal can be used even during actual operation of the voltage controlled oscillator, and the voltage controlled oscillator can be constantly monitored.

A voltage controlled oscillator device in accordance with the present invention comprises the above voltage controlled oscillator an A/D converter for converting the signal outputted by the signal output unit into digital data, and a control circuit for controlling the voltage controlled oscillator by inputting the output data of the A/D converter to control the voltage controlled oscillator, and can monitor the condition of the oscillator, and a whole voltage controlled oscillator device having the voltage controlled oscillator is appropriately operated according to whether the voltage controlled oscillator is operating normally or abnormally.

A radar device of the present invention comprises the above-described voltage controlled oscillator and a transceiver for receiving a reflected signal from a target. The target can be searched thereby in a normal condition of the voltage controlled oscillator.

BRIEF DESCRIPTION OF THE DRAWING(S)

DETAILED DESCRIPTION OF EMBODIMENTS OF THE INVENTION

A voltage controlled oscillator according to a first embodiment is explained with reference to FIGS. 1A and 1B.

Figure 1A:
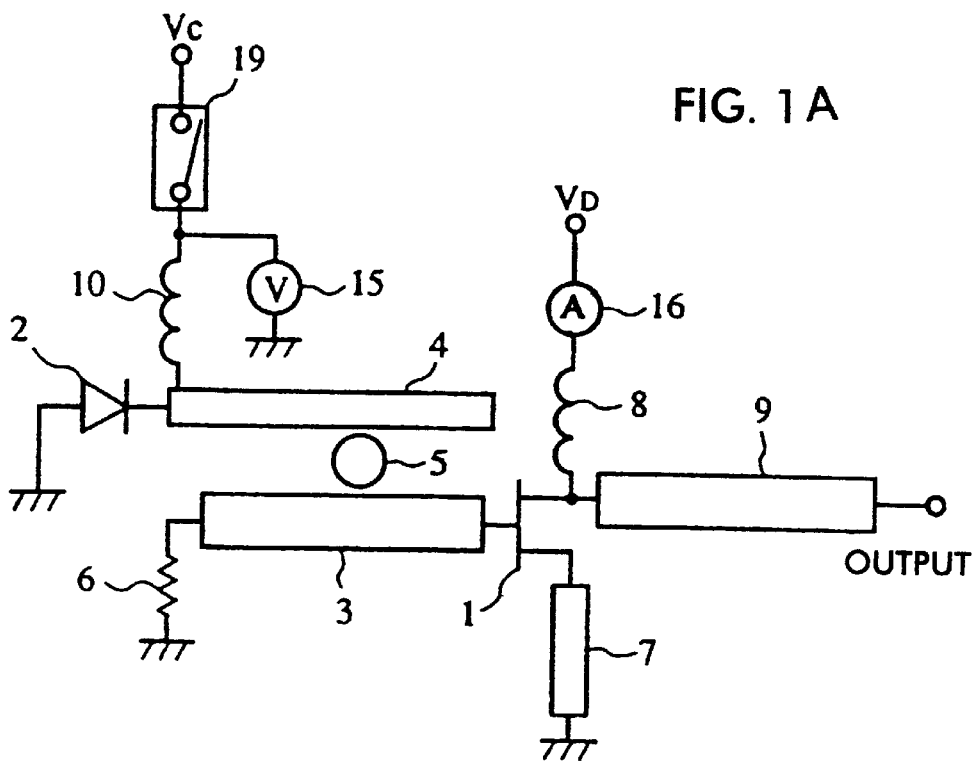
FIGS. 1A–1B are block diagrams of a voltage controlled oscillator according to a first embodiment of the present invention.
Figure 1B:
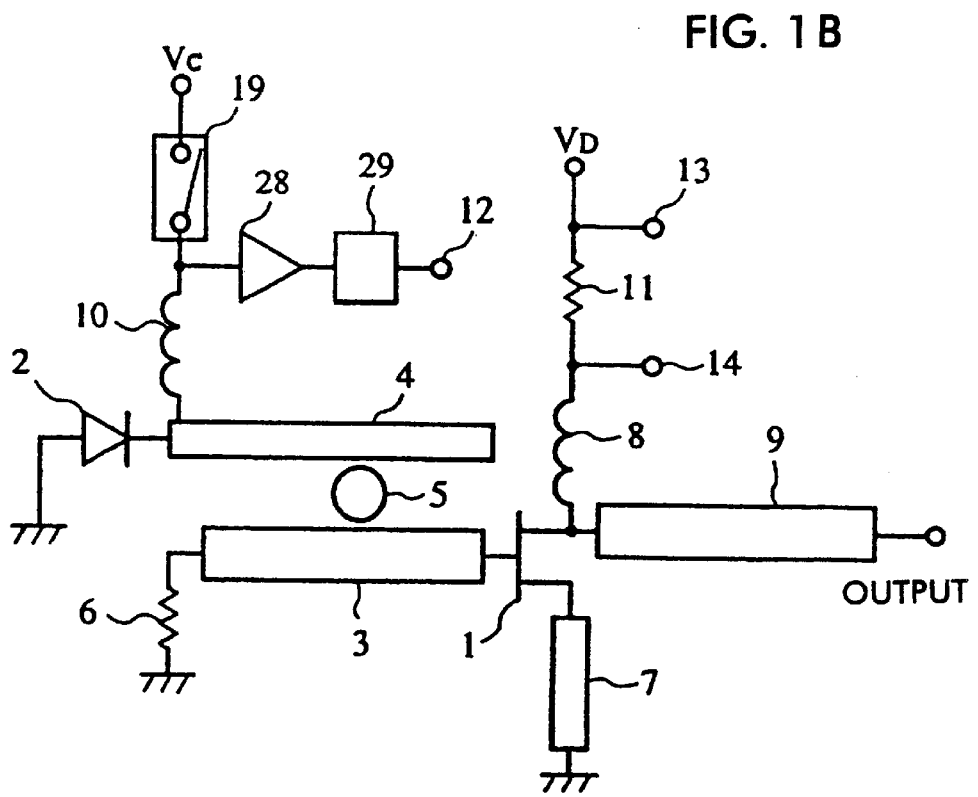

FIGS. 1A and 1B show two examples. In FIG. 1A, a main line 3 comprising a microstrip line has a gate of an oscillation device 1 which may comprise an FET connected to one end thereof and a terminating resistor 6 connected to the other end thereof. A line 7 comprising a microstrip line is disposed between the source of the oscillation device 1 and ground. A bias voltage VD is applied to the drain via an inductor 8 and a current monitor 16. An oscillation signal is outputted via an output line 9 comprising a microstrip line.

A dielectric resonator 5 is coupled with the main line 3 at a predetermined position thereof. A sub line 4 comprising a microstrip line is disposed in the vicinity of the resonator 5 at a predetermined position to achieve coupling. A variable reactance element 2 comprising e.g., a varactor diode, is connected between one end of the sub line 4 and ground. A circuit to supply a control voltage Vc to the variable reactance element 2 is connected to the sub line 4 via an inductor 10 and a switching circuit 19. In addition, a voltage monitor 15 is disposed between one end of the inductor 10 and ground.

The above oscillation device 1 works as a negative resistive element, and the whole circuit works as a band reflection oscillator. The oscillation frequency is determined by the line length of the microstrip line of the line 7, the coupling position of the resonator 5 with the main line 3, and the resonance frequency of the resonator 5. The capacitive load on the resonator 5 changes according to the capacitance of the variable reactance element 2, the resonance frequency of the resonator 5 changes, and as a result, the oscillation frequency changes, and thus the oscillation frequency is controlled by the control voltage Vc applied to the variable reactance element 2.

Under normal conditions of the voltage controlled oscillator shown in FIG. 1A, when the switching circuit 19 is ON, the control voltage Vc is applied to the variable reactance element 2. In detecting the presence or absence of any failures, the switching circuit 19 is OFF. The oscillation signal is supplied to the variable reactance element 2 along the path: the main line 3, the resonator 5, the sub line 4, the variable reactance element 2. Thus, the detection signal is supplied to the voltage monitor 15 from the cathode-side of the variable reactance element 2. Thus, in detecting the presence or absence of any failures, the oscillation condition can be regarded as normal if the voltage level monitored by the voltage monitor 15 exceeds a predetermined level. Further, if the voltage level is substantially zero, it can be assumed that no oscillation occurs, or the variable reactance element 2 has failed in an open mode or in a short-circuit mode.

On the other hand, in FIG. 1A, the current monitor 16 constantly detects the drain current in the oscillation device 1, and if the detected current is substantially zero, it can be assumed that the oscillation device 1 has failed in an open mode. If the detected current is larger than a predetermined value, it can be assumed that the oscillation device 1 has failed in a short-circuit mode.

Thus, when the presence or absence of any failures of the oscillation device 1 is detected using the current monitor 16 which detects the current flowing in the oscillation device 1, and the current flowing in the oscillation device 1 is within a normal range, i.e., when it is assumed that oscillation occurs, it can be assumed that the variable reactance element 2 has failed in an open mode or in a short-circuit mode unless the signal level of the variable reactance element 2 detected by the voltage monitor 15 is within a normal range.

FIG. 1B shows more specifically the configuration of a monitoring component to detect a failure in the voltage controlled oscillator shown in FIG. 1A. In the figure, numeral 28 denotes an amplifier for amplifying the detection signal by the variable reactance element 2, and numeral 29 denotes a smoothing circuit for smoothing the amplified signal. In this configuration, the DC voltage according to the level of the oscillation output in detecting the presence or absence of any failure can be obtained at a monitoring terminal 12.

A current detecting resistor 11 is inserted in a current path in which the drain current of the oscillation device 1 flows, and monitoring terminals 13 and 14 are disposed at both ends thereof. If the voltage between the monitoring terminals 13 and 14 and the ground is detected, the differential voltage therebetween is a voltage proportional to the current flowing in the oscillation device 1.

Thus, similar to the configuration shown in FIG. 1A, the presence or absence of a failure of the oscillation device 1 and a failure of the variable reactance element 2 can be detected based on the output voltage of the monitoring terminal 12 and the differential voltage between the monitoring terminals 13 and 14 shown in FIG. 1B.

Figure 2:
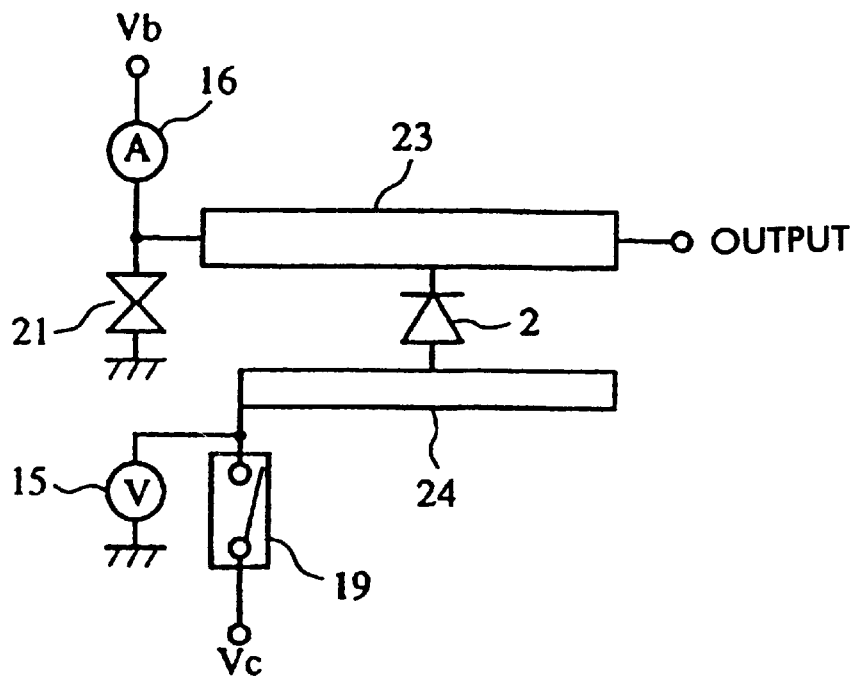
FIG. 2 is a block diagram of a voltage controlled oscillator of a second embodiment of the present invention.

FIG. 2 shows the configuration of a voltage controlled oscillator according to a second embodiment. In this example, a Gunn diode 21 is provided as an oscillation device. No resonator to be coupled with a main line is provided. In FIG. 2, numeral 23 denotes a main line, the Gunn diode 21 is disposed between one end thereof and ground, and a bias voltage Vb is applied to the Gunn diode 21 via the current monitor 16. Numeral 24 denotes a sub line, and a varactor diode 2 which is a variable reactance element is connected between the sub line 24 and the main line 23. A control voltage Vc is applied to the varactor diode 2 via the switching circuit 19. In addition, the detection signal from the varactor diode 2 can be monitored by the voltage monitor 15 with the switching circuit 19 in the OFF state.

Also in the voltage controlled oscillator of this configuration, it can be assumed that no oscillation occurs, or the varactor diode 2 itself has failed if the level of the detection signal from the varactor diode 2 is substantially zero when detecting the presence or absence of any failures. If the current flowing in the Gunn diode 21 is substantially zero, it can be regarded that the Gunn diode 21 has failed in an open mode, and if the current value exceeds the predetermined range, it can be assumed that the Gunn diode 21 has failed in a short-circuit mode.

In the example shown in FIG. 2, the current monitor 16 and the voltage monitor 15 are indicated by the symbols of an ammeter and a voltmeter, respectively; however, similarly to the configuration shown in FIG. 1B, the detection signal from the varactor diode 2 may be extracted as a DC voltage signal via an amplifier and a smoothing circuit. Alternatively, a current detecting resistor is inserted in the current path flowing in the Gunn diode 21, and the voltage drop across the resistor may be detected.

Figure 3:
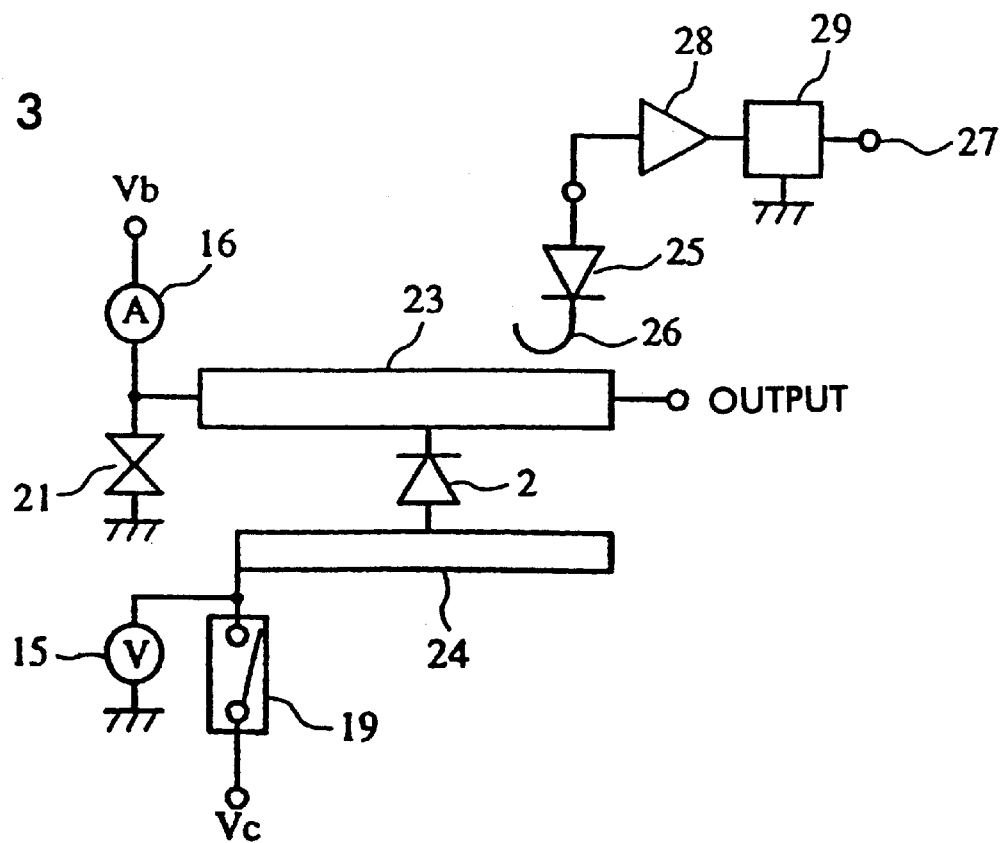
FIG. 3 is a block diagram of a voltage controlled oscillator of a third embodiment of the present invention.

FIG. 3 shows the configuration of a voltage controlled oscillator according to a third embodiment. In this example, a pick-up 26 to be coupled with the main line 23 is disposed in the circuit shown in FIG. 2, and the voltage controlled oscillator circuit includes a Schottky barrier diode (SBD) 25 for detecting the detection signal from the pick-up 26, an amplifier 28 for amplifying the detection signal, and a smoothing circuit 29 for smoothing the amplified signal.

The pick-up 26 is a line pattern disposed close to a predetermined position of the main line 23 comprising the microstrip line, and is weakly coupled with the main line 23. Thus, irrespective of the state of a switching circuit 19, the detection signal is constantly outputted from the Schottky barrier diode 25 when it is in the oscillating state, and a predetermined DC voltage level is generated at a monitoring terminal 27 by amplifying and smoothing the detection signal. Thus, the presence or absence of oscillation is detected by the output voltage level of the monitoring terminal 27, the presence or absence of any failures of the varactor diode 2 is detected by the voltage monitor 15 in the oscillating state, and the presence or absence of any failures of the Gunn diode 21 can be detected by the current monitor 16. In addition, if the varactor diode 2 and the Gunn diode 21 are both operating normally, it can be assumed that the Schottky barrier diode 25 has failed in an open mode or in a short-circuit mode if the output voltage of the monitoring terminal 27 is substantially zero.

Next, a radar device according to a fourth embodiment is described with reference to FIGS. 4 and 5.

Figure 4:
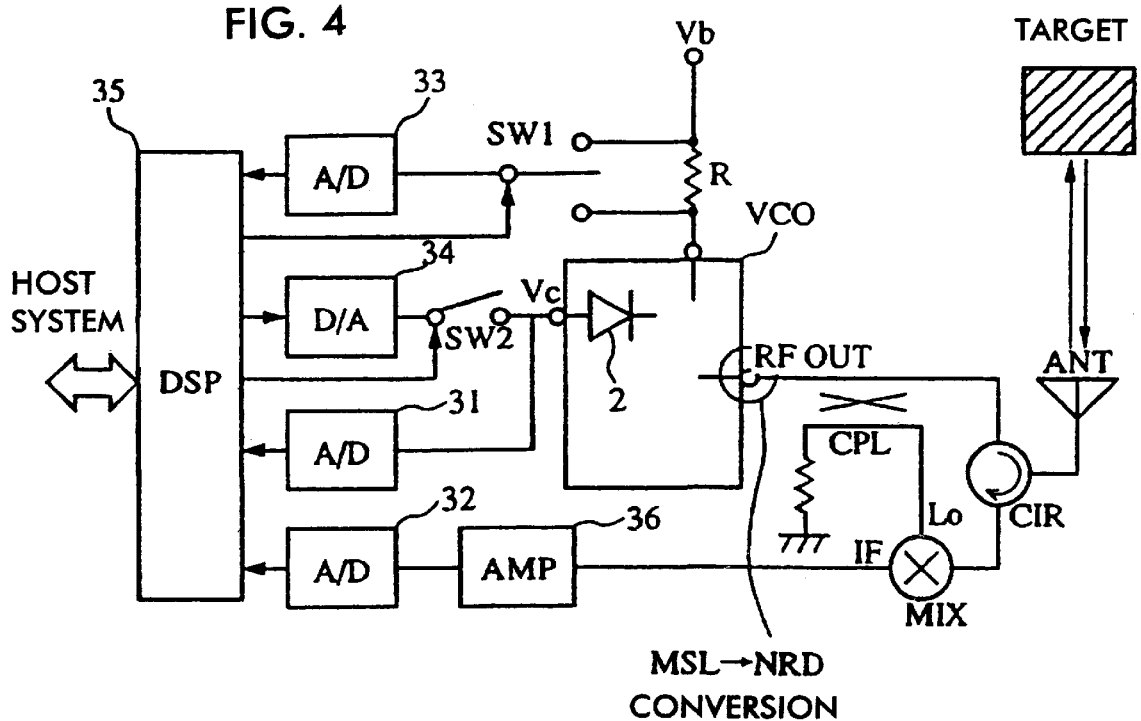
FIG. 4 is a block diagram of a voltage controlled oscillator and a millimeter wave radar of a fourth embodiment of the present invention.

In FIG. 4, a portion indicated by VCO is one of the voltage controlled oscillators shown in the second and third embodiments. Vb denotes a bias voltage power supply for the Gunn diode 21 shown in FIG. 2 or FIG. 3, and a current detecting resistor R is connected in series in the current path. The voltage across the current detecting resistor R is supplied to an A/D converter 33 via a switching circuit SW1. The A/D converter 33 converts either voltage of the resistor R according to the selection of the switching circuit SW1 into digital data. Numeral 34 denotes a D/A converter, and the D/A converter 34 generates a voltage signal according to the control data supplied from a digital signal processing circuit 35, and supplies the voltage signal via a switching circuit SW2 as the control voltage Vc of the voltage controlled oscillator VCO. An A/D converter 31 converts the detection signal of the varactor diode 2 when the switching circuit SW2 is in the OFF state into digital data, and supplies the converted digital data to the digital signal processing circuit 35. The digital signal processing circuit 35 switches the switching circuit SW2 ON under normal conditions, and OFF when the presence or absence of any failures is detected. The output signal of the voltage controlled oscillator VCO is converted from the microstrip line to an NRD guide (Non-Radiating Dielectric guide), and is supplied by the NRD guide to an antenna ANT via a coupler CPL, and a circulator CIR. A millimeter wave signal is transmitted from the antenna. When a reflected wave from a target is received, the received signal is guided to a mixer MIX via the circulator CIR. This mixer MIX receives a local signal Lo extracted from the coupler CPL, and converts the local signal Lo into an intermediate frequency signal IF. An amplifier 36 amplifies this intermediate frequency signal IF, and an A/D converter 32 converts the amplified signal into digital data and supplies the data to the digital signal processing circuit 35.

The digital signal processing circuit 35 periodically turns off the switching circuit SW2, and compares the output value from the A/D converter 31 with a predetermined value to judge whether or not the circuit is in an oscillating state. When the switching circuit SW2 is turned on, the data for modulation is continuously supplied to the A/D converter 34 to modulate the transmission signal, and the distance from the antenna to the target and the relative speed of the target are calculated based on the data stream from the A/D converter 32. These results are supplied to a host system.

Figure 5:
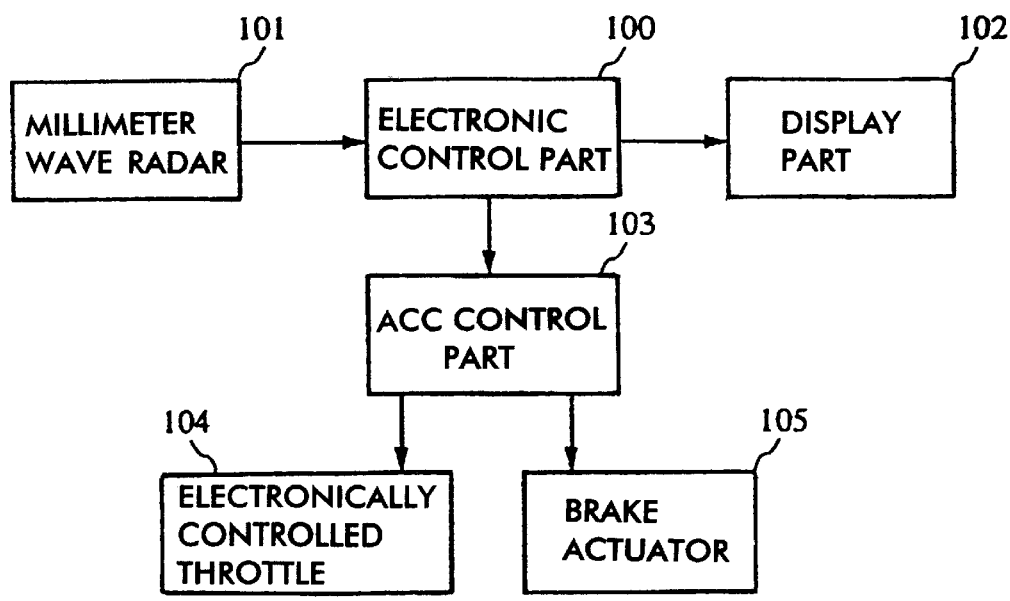
FIG. 5 is a block diagram of an automatic vehicle control system using the above millimeter wave radar.

FIG. 5 is a block diagram of a complete automatic vehicle control system using the millimeter wave radar shown in FIG. 4.

A millimeter wave radar 101 is the device shown in FIG. 4, and an electronic control unit 100 is the host system in FIG. 4. This electronic control unit 100 receives detailed information on failures of the millimeter wave radar, and supplies the information to a display unit 102 as display data. Numeral 104 denotes an electronically controlled throttle, and numeral 105 denotes a brake actuator. An ACC control unit 103 controls the electronically controlled throttle 104 and the brake actuator 105.

The ACC control unit 103 automatically controls the electronically controlled throttle 104 and the brake actuator 105 based on the information from the millimeter wave radar 101 and the distance information to the target and the relative speed to a vehicle driving forward. When the electronic control unit 100 receives the failure information from the millimeter wave radar 101, the electronic control unit 100 supplies a control-off command to the ACC control unit 103. When the ACC control unit 103 receives the control-off command, the ACC control unit stops the automatic control of the electronically controlled throttle 104 and the brake actuator 105, and the driving mode is switched to the manual mode by a driver. Further, the throttle is automatically controlled to control the speed so as not to exceed the present value.

The example in FIG. 4 shows failure detection based on the detection signal from the varactor diode 2 of the voltage controlled oscillator VCO; alternatively, failure of the oscillation device may be detected based on the value of the current flowing in the oscillation device, as shown in FIG. 3 or the like, or the presence or absence of the oscillation may be detected based on the detection signal from the Schottky barrier diode 25.

In accordance with the present invention, it can be reliably determined whether or not the variable reactance element is in a normal oscillating state according to the presence or absence of a detection signal by monitoring the detection signal in the variable reactance element.

Further, in accordance with the present invention, it can be detected whether or not a non-oscillating state is attributable to the failure of the oscillation device, and also the failure of the oscillation device can be detected by providing a signal output unit to detect the current flowing in the oscillation device. In addition, failure of each of the variable reactance element and the oscillation device can be detected through the combination of the monitoring of the detection signal by the variable reactance element with the monitoring of the current flowing in the oscillation device.

The voltage controlled oscillator can be constantly monitored even during actual operation of the voltage controlled oscillator by providing a pick-up, which is weakly coupled to the line having the above-described oscillation device connected thereto, and a diode to detect the detection signal from the pick-up.

The state of the oscillator can be monitored by the A/D converter which converts the signal outputted by either the above-described signal output units into digital data, and the control circuit which controls the voltage controlled oscillator by inputting the data output from the A/D converter to control the voltage controlled oscillator. The whole voltage controlled oscillator device having the voltage controlled oscillator can be appropriately operated according to whether the voltage controlled oscillator is operating normally or abnormally.

The target can be reliably searched for the normal operating state of the voltage controlled oscillator by providing the voltage controlled oscillator and a transmitter-receiver to receive the reflected signal from the target.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A voltage controlled oscillator comprising:
   a line;
   a variable reactance element connected to the line via a resonator;
   an oscillation device connected to the line; and
   a signal output unit to output a detected signal present at said variable reactance element.

2. The voltage controlled oscillator of claim 1, further comprising:
   a second signal output unit to output a signal detecting a current flowing in said oscillation device.

3. The voltage controlled oscillator of claim 1, wherein the detected signal comprises one of a voltage signal at said variable reactance element and a current signal through said variable reactance element.

4. The voltage controlled oscillator of claim 1, further comprising a second signal output unit to detect one of a voltage at said oscillation device and a current through said oscillation device.

5. The voltage controlled oscillator of claim 3, wherein the signal output unit detects a voltage signal at said variable reactance element.

6. The voltage controlled oscillator of claim 4, wherein the second signal output unit detects a current through said oscillation device.

7. The voltage controlled oscillator of claim 5, wherein when the voltage level is above a threshold, a normal oscillation condition is determined and when the voltage level is substantially zero, a failure of the variable reactance element on the oscillation device is determined.

8. The voltage controlled oscillator of claim 6, wherein when the second signal output is substantially zero, it is determined that the oscillation device has failed in an open mode and when the signal output is above a predetermined value, it is determined that the oscillation device has failed in a short circuit mode.

9. The voltage controlled oscillator of claim 1, wherein the oscillator device comprises one of an FET and a Gunn diode.

10. The voltage controlled oscillator of claim 9, wherein the detection signal comprises a voltage level whereby the presence or absence of oscillation of said oscillator device can be determined.

11. The voltage controlled oscillator of claim 1, wherein the variable reactance element is directly connected to the line via the resonator.

12. The voltage controlled oscillator of claim 1, wherein the variable reactance element is indirectly connected to the line via the resonator.

13. A voltage controlled oscillator comprising:
   a line;
   a variable reactance element connected to the line;
   an oscillation device connected to the line;
   a signal output unit to output a detected signal present at said variable reactance element;
   a pick-up which is coupled to the line having said oscillation device connected thereto;
   a detector for detecting a signal provided by said pick-up; and
   a second signal output a detection signal from said detector.

14. The voltage controlled oscillator of claim 13, wherein the detector comprises a diode.

15. A voltage controlled oscillator device comprising:
   a voltage controlled oscillator comprising:
      a line;
      a variable reactance element connected to the line via a resonator;
      an oscillation device connected to the line; and
      a signal output unit to output a detected signal present at said variable reactance element;
   an A/D converter for converting the signal outputted from the signal output unit into digital data; and
   a control unit for controlling said voltage controlled oscillator in accordance with the digital data output from said A/D converter.

16. The voltage controlled oscillator device of claim 15, further comprising a switching circuit controlled by said control unit for enabling and disabling said voltage controlled oscillator in accordance with the signal output from the signal output unit.

17. The voltage controlled oscillator device of claim 16, further wherein the switching circuit is controlled by said control unit to enable and disable said voltage controlled oscillator in accordance with a signal from the signal output unit detecting a failure in said variable reactance element.

18. The voltage controlled oscillator device of claim 17, further comprising a transmitter/receiver coupled to said voltage controlled oscillator and control unit, the voltage controlled oscillator being controlled by said control unit and providing a modulated RF output signal to the transmitter/receiver, the transmitter/receiver providing a received signal received by an antenna to said control unit for determining the presence of an object.

19. The voltage controlled oscillator of claim 15, wherein the variable reactance element is directly connected to the line via the resonator.

20. The voltage controlled oscillator of claim 15, wherein the variable reactance element is indirectly connected to the line via the resonator.

21. A radar device comprising:
   a voltage controlled oscillator comprising:
      a line;
      a variable reactance element connected to the line;
      an oscillation device connected to the line;
      a signal output unit to output a detected signal present at said variable reactance element; and
   a transceiver coupled to said voltage controlled oscillator has been inserted; for transmitting a signal to a target and for receiving a reflected signal from the target;
   pick-up which is coupled to the line having said oscillation device connected thereto;
   a detector for detecting a signal provided by said pick-up;
   and a second signal output unit to output a detection signal from said detector.

22. The radar device of claim 21, further comprising a second signal output unit to output a signal detecting a current flowing in said oscillation device.

23. The radar device of claim 21, further comprising:
   an A/D converter for converting the signal outputted from the signal output unit into digital data; and
   a control unit for controlling said voltage controlled oscillator in accordance with the digital data output from said A/D converter.

* * * * *